(12) United States Patent
Chang

(10) Patent No.: US 10,318,208 B2
(45) Date of Patent: Jun. 11, 2019

(54) MEMORY APPARATUS FOR EXECUTING MULTIPLE MEMORY OPERATIONS BY ONE COMMAND AND OPERATING METHOD THEREOF

(71) Applicant: Winbond Electronics Corp., Taichung (TW)

(72) Inventor: Chih-Hsiang Chang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 203 days.

(21) Appl. No.: 15/346,732

(22) Filed: Nov. 9, 2016

(65) Prior Publication Data

US 2018/0005672 A1    Jan. 4, 2018

(30) Foreign Application Priority Data

Jun. 30, 2016   (CN) .......................... 2016 1 0504243

(51) Int. Cl.
*G06F 3/06* (2006.01)
*G11C 7/10* (2006.01)
*G11C 11/409* (2006.01)

(52) U.S. Cl.
CPC .......... *G06F 3/0659* (2013.01); *G06F 3/0625* (2013.01); *G11C 7/109* (2013.01); *G11C 7/1048* (2013.01); *G11C 7/1072* (2013.01); *G11C 11/409* (2013.01); *G06F 3/0673* (2013.01)

(58) Field of Classification Search
CPC ..... G11C 7/1048; G11C 7/1072; G11C 7/109; G11C 11/409; G06F 3/061; G06F 3/0625; G06F 3/0658; G06F 3/0659; G06F 3/0673; G06F 3/0679; G06F 2003/0691; G06F 2003/0697; G06F 9/3895; G06F 13/1668; G06F 13/1689
USPC ........................................................ 711/105
See application file for complete search history.

(56) References Cited

U.S. PATENT DOCUMENTS

| | | | | |
|---|---|---|---|---|
| 5,345,573 A | * | 9/1994 | Bowden, III | ....... G06F 12/0879 365/189.02 |
| 5,923,612 A | * | 7/1999 | Park | ...................... G06F 9/3017 365/189.07 |
| 8,131,889 B2 | * | 3/2012 | Lee | ...................... G06F 13/126 710/22 |

(Continued)

OTHER PUBLICATIONS

Micron Technology, Inc., "DDR4 SDRAM" 2014, pp. 1,4-18,22-23,26-28,44-72,201,230-231. (Year: 2014).*

(Continued)

*Primary Examiner* — Reginald G Bragdon
*Assistant Examiner* — Aaron D Ho
(74) *Attorney, Agent, or Firm* — JCIPRNET

(57) ABSTRACT

A memory apparatus including a memory cell array, a register unit and a command generator is provided. The memory cell array includes a plurality of memory cells. The register unit is configured to record a plurality of user-defined information. The command generator receives a user-defined command and operates at least two memory operations on the memory cell array according to the received user-defined command and the user-defined information. The user-defined information is generated according to the at least two memory operations. Furthermore, an operating method of a memory apparatus is also provided.

20 Claims, 5 Drawing Sheets

(56) References Cited

U.S. PATENT DOCUMENTS

| | | | |
|---|---|---|---|
| 9,021,146 B2* | 4/2015 | Ross | G06F 13/1621 |
| | | | 710/24 |
| 9,465,728 B2* | 10/2016 | Tsai | G06F 12/00 |
| 2003/0200474 A1* | 10/2003 | Li | G06F 1/3203 |
| | | | 713/320 |
| 2003/0218929 A1* | 11/2003 | Fibranz | G11C 29/12015 |
| | | | 365/201 |
| 2006/0052885 A1* | 3/2006 | Kong | G06F 1/1626 |
| | | | 700/84 |
| 2006/0167993 A1 | 7/2006 | Aaron et al. | |
| 2007/0150671 A1* | 6/2007 | Kurland | G06F 9/3004 |
| | | | 711/154 |
| 2009/0097339 A1 | 4/2009 | Sohn et al. | |
| 2011/0191527 A1 | 8/2011 | Fukuda | |
| 2014/0185362 A1 | 7/2014 | Haukness | |
| 2014/0298071 A1 | 10/2014 | Hwang | |
| 2015/0198968 A1 | 7/2015 | Ko | |
| 2017/0060450 A1* | 3/2017 | Roberts | G06F 3/0619 |

OTHER PUBLICATIONS

"Office Action of Taiwan Counterpart Application", dated Sep. 25, 2017, p. 1-p. 7.
"Office Action of Taiwan Counterpart Application," dated Jun. 14, 2017, p. 1-p. 5.

* cited by examiner

US 10,318,208 B2

MEMORY APPARATUS FOR EXECUTING MULTIPLE MEMORY OPERATIONS BY ONE COMMAND AND OPERATING METHOD THEREOF

CROSS-REFERENCE TO RELATED APPLICATION

This application claims the priority benefit of China application serial no. 201610504243.8, filed on Jun. 30, 2016. The entirety of the above-mentioned patent application is hereby incorporated by reference herein and made a part of this specification.

BACKGROUND OF THE INVENTION

Field of the Invention

The invention relates to a memory apparatus and an operating method thereof, and particularly relates to a memory apparatus capable of self-defining a memory command and an operating method thereof.

Description of Related Art

A synchronous dynamic random-access memory (SDRAM) is a DRAM having a synchronous interface, which achieves synchronization with a computer bus through a clock signal. Along with progress of memory technology, a double data rate synchronous dynamic random access memory (DDR SDRAM) is also developed. The DDR SDRAM is a SDRAM having double transmission rate, which may implement data transmission at both of a rising edge and a falling edge of a system clock, so that the transmission rate thereof is twice of the system clock to achieve higher working efficiency.

In order to further improve the working efficiency, a second generation, a third generation and a fourth generation DDR SDRAM have been developed. However, according to standards set to the DRAM by the JEDEC solid state technology association, when an access operation is executed on the DRAM, it requires to consecutively receive a plurality of memory commands from a memory controller, and respectively execute corresponding memory operations according to each of the memory command in order to complete the access operation. For example, when a batch of data is to be written, the memory controller consecutively sends three memory commands corresponding to memory operations of activate row address, read column address and precharge to the DRAM, and the DRAM consecutively completes the aforementioned three memory operations. In another example, when a plurality batches of data is to be written consecutively, the memory controller is not only required to repeatedly send RD commands to the DRAM, but is also required to transmit a plurality of memory addresses to the DRAM. Therefore, if excessive data transmission (including memory commands or addresses, etc.) between the memory controller and the DRAM can be decreased, system efficiency is improved, and system power consumption is decreased.

SUMMARY OF THE INVENTION

The invention is directed to a memory apparatus and an operating method thereof, by which a number of transmissions of memory commands is decreased to improve access efficiency of the memory apparatus and decrease power consumption thereof.

The invention provides a memory apparatus including a memory cell array, a register unit and a command generator. The memory cell array includes a plurality of memory cells. The register unit is configured to record a plurality of user-defined information. The command generator is coupled to the register unit and the memory cell array. The command generator receives a user-defined command and executes at least two memory operations on the memory cell array according to the received user-defined command and the user-defined information. The user-defined information is generated according to the at least two memory operations.

The invention provides an operating method of memory apparatus, which is adapted to a memory apparatus including a memory cell array and a register unit. The operating method of memory apparatus includes following steps. A plurality of user-defined information is written into the register unit. A user-defined command is received. At least two memory operations are executed on the memory cell array according to the received user-defined command and the user-defined information. The user-defined information is generated according to the at least two memory operations.

According to the above descriptions, in the embodiment of the invention, a plurality of user-defined information is recorded in the register unit of the memory apparatus, and the operating method of memory apparatus is adapted to execute at least two memory operations according to the user-defined command and the user-defined information when the memory apparatus receives the user-defined command. In this way, access efficiency of the memory apparatus is improved, and power consumption thereof is decreased.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
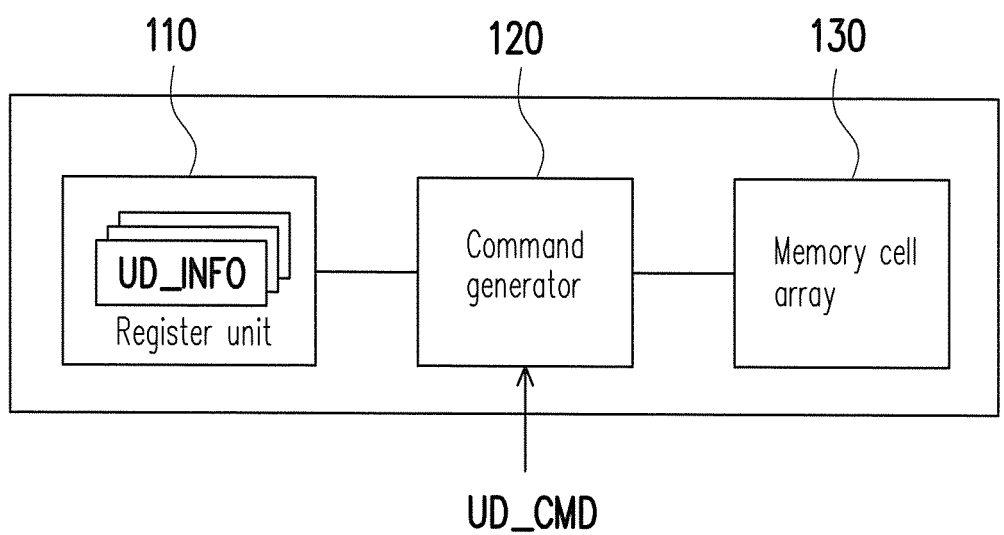
FIG. 1 is a schematic block diagram of a memory apparatus according to an embodiment of the invention.

FIG. 1 is a schematic block diagram of a memory apparatus according to an embodiment of the invention. Referring to FIG. 1, the memory apparatus 100 of the present embodiment includes a register unit 110, a command generator 120 and a memory cell array 130. In the present embodiment, the register unit 110 is, for example, a mode register (MR), which records a plurality of user-defined information UD_INFO. The command generator 120 is, for example, a state machine, which is driven by a system clock to execute at least two memory operations on the memory cell array 130 according to a received user-defined command UD_CMD and the user-defined information UD_INFO recorded in the register unit 110.

For example, after the memory apparatus 100 is power on, the memory apparatus 100 may experience various states including initialization, idle, activate, precharge, etc., where in the idle state, the memory apparatus 100 may enter a mode register set (MRS) state. In an embodiment, the aforementioned user-defined information UD_INFO is, for example, written into the register unit 110 in the MRS state. When the command generator 120 receives the user-defined command UD_CMD, the command generator 120 may execute at least two memory operations on the memory cell array 130 according to the user-defined information UD_INFO recorded in the register unit 110. An operating method of memory apparatus of the invention is described below with reference of the memory apparatus 100 of FIG. 1.

Figure 2:
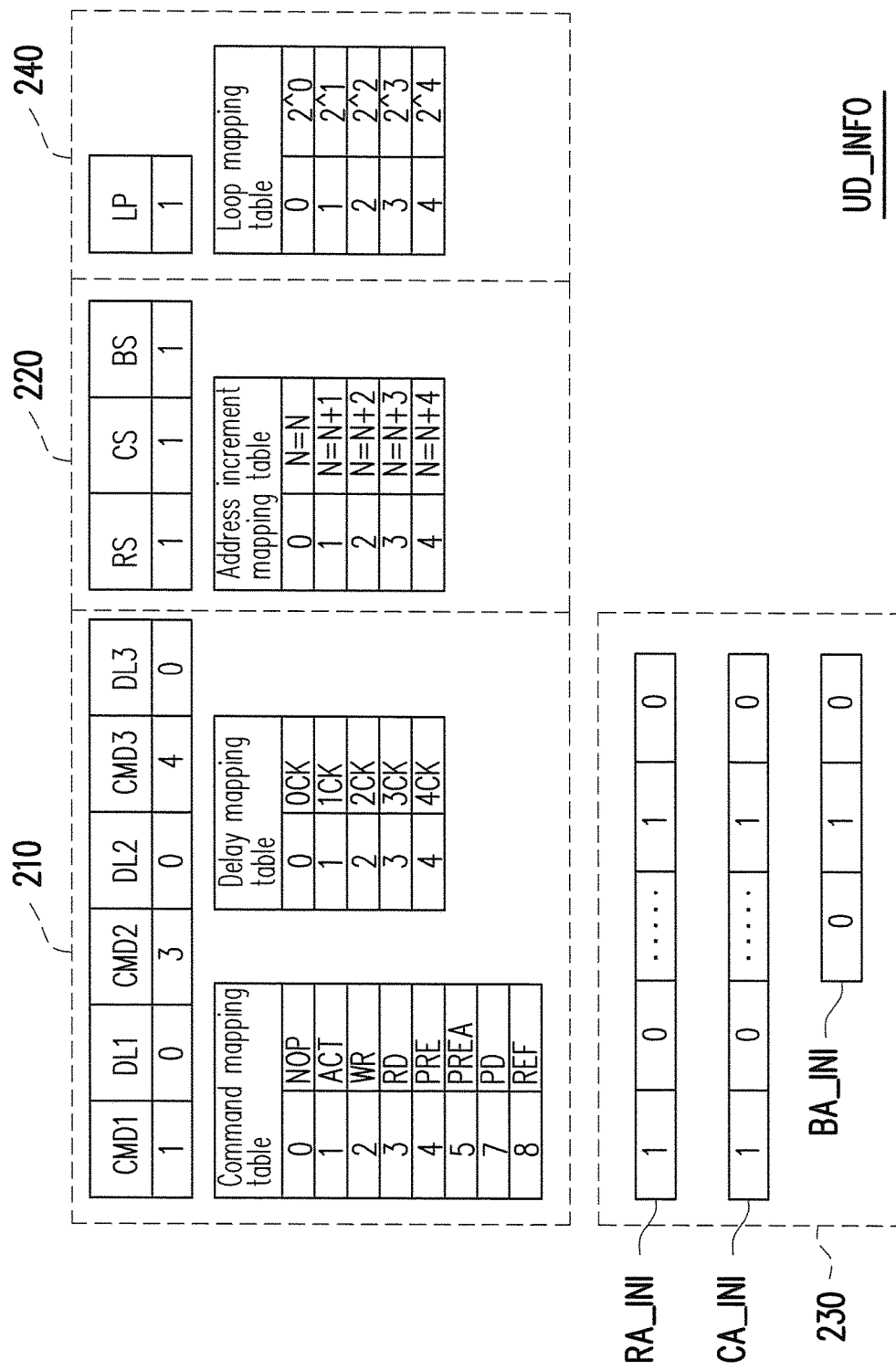
FIG. 2 is a schematic diagram of user-defined information according to an embodiment of the invention.

FIG. 2 is a schematic diagram of user-defined information according to an embodiment of the invention. Referring to FIG. 2, the user-defined information UD_INFO of the present embodiment is information defined by the user to facilitate the memory apparatus 100 correspondingly executing memory operations, and is recorded in the register unit 110. In the present embodiment, the user-defined information UD_INFO includes command flow information 210, address increment information 220, initial address information 230 and loop information 240. However, the invention is not limited thereto. In other embodiments, those skilled in the art may adjust the information included in the user-defined information UD_INFO according to different requirements, such that when the memory apparatus 100 receives the user-defined command UD_CMD, the memory apparatus 100 may execute the required at least two memory operations according to the user-defined information UD_INFO.

In the present embodiment, the command flow information 210 includes command information CMD1-CMD3 and delay information DL1-DL3, which are configured to provide operation information used for operating the memory cell array 130. For example, the command information CMD1-CMD3 are respectively 1, 3 and 4, which respectively correspond to three memory operations of activate (ACT), read (RD) and precharge (PRE). The delay information DL1-DL3 all correspond to 0 clock period (CK), which respectively represent additional delay time customized by the user besides a delay time required by a specification of the memory itself after the memory operations of the corresponding command information CMD1-CMD3 are executed. In detail, the command information CMD1 and CMD2, for example, respectively correspond to the memory operations of ACT and RD. Generally, after the memory apparatus 100 executes the activate operation, it has to at least go through a row controller to column controller transmission delay (RAS# to CAS# delay, $T_{RCD}$) before continually receiving a read command to execute a read operation. The user-defined information UD_INFO of the present embodiment further defines the delay information DL1, such that after the memory apparatus 100 executes the command information CMD1 corresponding to the activate operation, the memory apparatus 100 has to go through the delays of $T_{RCD}$ and DL1 before continually executing the command information CMD2 corresponding to the read operation, so as to improve stableness of the memory apparatus 100.

In the present embodiment, the initial address information 230 includes an initial row address RA_INI, an initial column address CA_INI and an initial block address BA_INI. The initial address information 230 is configured to point one of a plurality of memory cells in the memory cell array 130. After the command generator 120 receives the user-defined command UD_CMD, the command generator 120 may execute at least two memory operations corresponding to the command flow information 210 on the memory cell array 130 or the memory cell pointed by the initial address information 230 according to the user-defined command UD_CMD and the user-defined information UD_INFO recorded in the register unit 110. For simplicity's sake, the memory cell corresponding to the initial address information 230 is referred to as first memory cell hereinafter.

Figure 3:
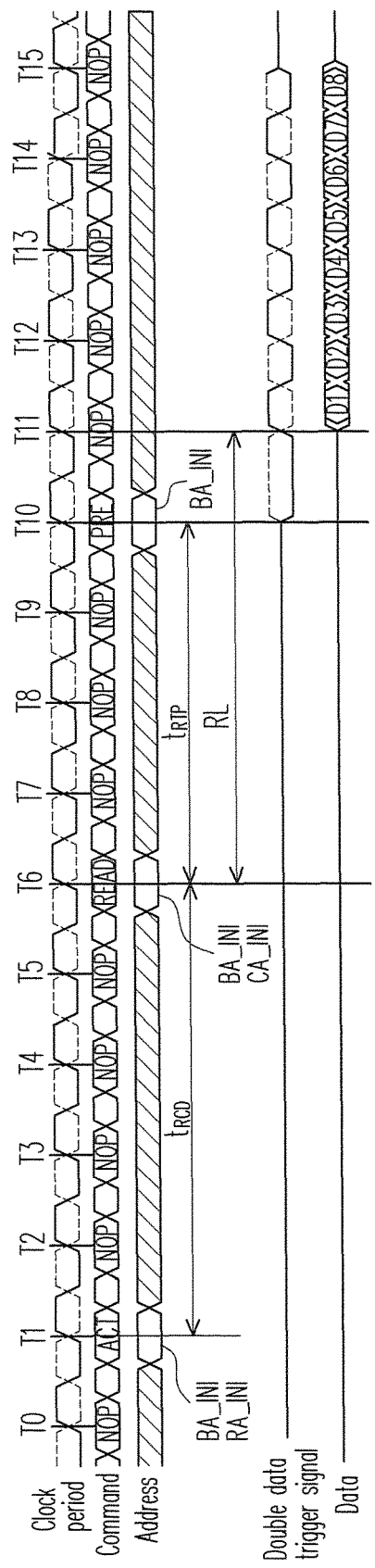
FIG. 3 is a schematic diagram of an operating method of memory apparatus according to a related art of the invention.

FIG. 3 is a schematic diagram of an operating method of memory apparatus according to a related art of the invention. Referring to FIG. 3, generally, when the memory apparatus is about to write a batch of data to the first memory cell with a row address, a column address and a block address of RA_INI, CA_INI and BA_INI, in a clock period T1, a memory command of ACT is first received from a memory controller, and the block address BA_INI and the row address RA_INI are provided. After the memory command of ACT is received, at least the row controller to column controller transmission delay $T_{RCD}$ is went through, and then a read memory command additionally providing the column address CA_INI is received from the memory controller in a clock period T6. After the read memory command is received, at least a read latency (RL) is went through, and then started from a clock period T11, data D1-D8 are read from the first memory cell. On the other hand, after the read memory command is received, at least an internal read to precharge command delay ($T_{RTP}$) is went through, and then in a time clock T10, a precharge (PRE) command is received from the memory controller to execute the precharge operation. In this way, the memory apparatus of the embodiment of FIG. 3 at least includes three memory command transmissions.

Figure 4:
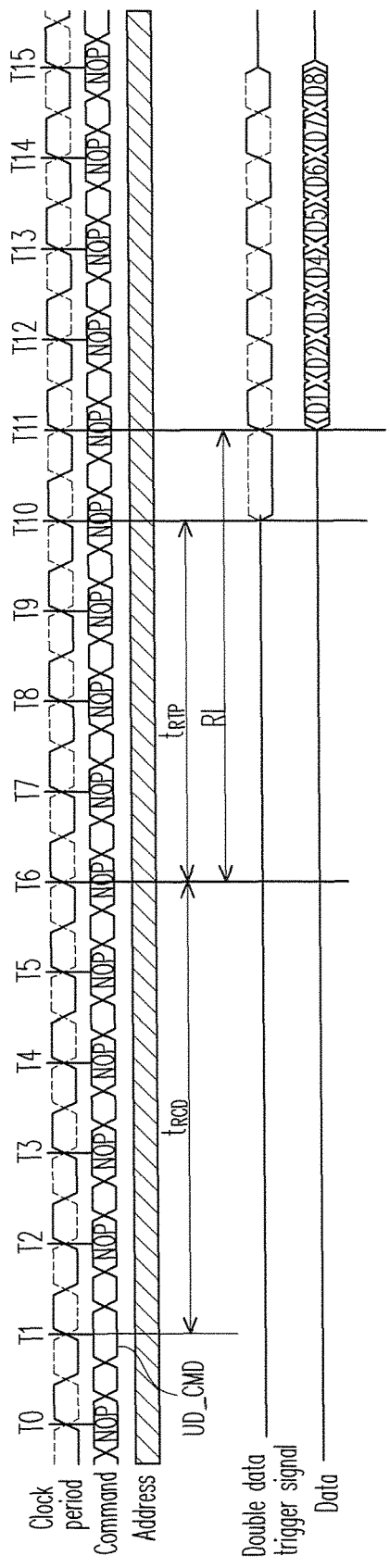
FIG. 4 is a schematic diagram of an operating method of memory apparatus according to an embodiment of the invention.

FIG. 4 is a schematic diagram of an operating method of memory apparatus according to an embodiment of the invention. Referring to FIG. 4, in the embodiment of the invention, the user-defined information UD_INFO including the command flow information 210 and the initial address information 230 is defined in the register unit 110 of the memory apparatus 100, where the user-defined information UD_INFO is generated according to the three memory operations of activate, read and precharge. In this way, in the present embodiment, after the command generator receives the user-defined command UD_CMD from external (for example, from the memory controller) at the clock period T1, the command generator 120 first executes an activate memory operation corresponding to the command information CMD1 according to the command flow information 210. Thereafter, after the row controller to column controller transmission delay $T_{RCD}$, a delay time corresponding to the delay information DL1 and the read delay RL are went through, the command generator 120 starts to execute a read operation to the first memory cell. On the other hand, after the user-defined command UD_CMD is received, after the row controller to column controller transmission delay $T_{RCD}$, the delay time corresponding to the delay information DL1 (which is 0 in the present embodiment), the internal read to precharge command delay $T_{RTP}$ and a delay time corresponding to the delay information DL2 (which is 0 in the present embodiment), the command generator 120 starts to execute the precharge operation to the memory cell array 130.

Compared to the operating method of memory apparatus of FIG. 3, the memory apparatus 100 of the embodiment of FIG. 4 only includes one transmission of the user-defined command UD_CMD in order to read the data D1-D8 from the first memory cell, and complete all of the memory operations in the embodiment of FIG. 3. Moreover, in the present embodiment, after the command generator 120 executes the precharge operation to the memory cell array 130, the command generator 120 may execute a next memory operation after going through a row precharge time $(T_{RP})$ and a delay time corresponding to the delay information DL3.

According to the operating method of memory apparatus of the embodiment of the invention, by defining the aforementioned command flow information 210 and the initial address information 230 to the user-defined information UD_INFO and storing the same in the register unit 110, after the command generator 120 receives the user-defined command UD_CMD, the command generator 120 may execute at least two memory operations on the memory cell array 130 according to the user-defined command UD_CMD and the user-defined information UD_INFO. It should be noted that in some cases, the user, for example, hopes to repeatedly execute the memory operations corresponding to the command flow information 210. Therefore, in the present embodiment, the address increment information 220 and the loop information 240 are further defined in the user-defined information UD_INFO.

Referring to FIG. 2, in the present embodiment, the address increment information 220 includes a row increment information RS, a column increment information CS and a block increment information BS, and the loop information 240 includes a loop number LP. The loop number LP is used for representing a repeat times of performing the memory operation on the memory cell array 130 according to the command flow information 210, and the address increment information 220 is used for determining the memory cell serving as an operation target when the memory operations are repeatedly executed. For example, the repeat times corresponding to the loop number LP is 2, the row increment information RS, the column increment information CS and the block increment information BS all correspond to N=N+1. In this way, after the command generator 120 executes the at least two memory operations on the first memory cell with the row address, the column address and the block address of RA_INI, CA_INI and BA_INI according to the initial address information 230 and the command flow information 210, the command generator 120 again executes the at least two memory operations on a memory cell with a row address, a column address and a block address of RA_INI+1, CA_INI+1 and BA_INI+1 according to the command flow information 210.

In the present embodiment, by further defining the address increment information 220 and the loop information 240 in the user-defined information UD_INFO, after receiving the user-defined command UD_CMD, the command generator 120 may repeatedly execute the at least two memory operations corresponding to the command flow information 210 on at least one memory cell in the memory cell array 130 according to the initial address information 230, the address increment information 220 and the loop information 240.

It should be noted that a command mapping table, a delay mapping table, and address increment mapping table and a loop mapping table in the user-defined information UD_INFO are used for indicating the content represented by the numbers in the command flow information 210, the address increment information 220 and the loop information 240, and a presenting method of the user-defined information UD_INFO is not limited by the invention. Besides the aforementioned mapping tables, in other embodiments, those skilled in the art may record the user-defined information UD_INFO through other methods according to different requirements.

In the present embodiment, the memory operations may include the activate, read and precharge operations, though the invention is not limited thereto. In other embodiments, the memory operation can be one of no operation, an activate operation, a read operation, a write operation, a precharge operation and a power down operation, etc.

On the other hand, in the present embodiment, the command information CMD1-CMD3, for example, respectively correspond to different memory operations. However, the invention is not limited thereto, and in another embodiment, the command information CMD1-CMD3, for example, correspond to a same memory operation. Another embodiment is provided below to describe the operating method of memory apparatus of the invention in detail.

Figure 5:
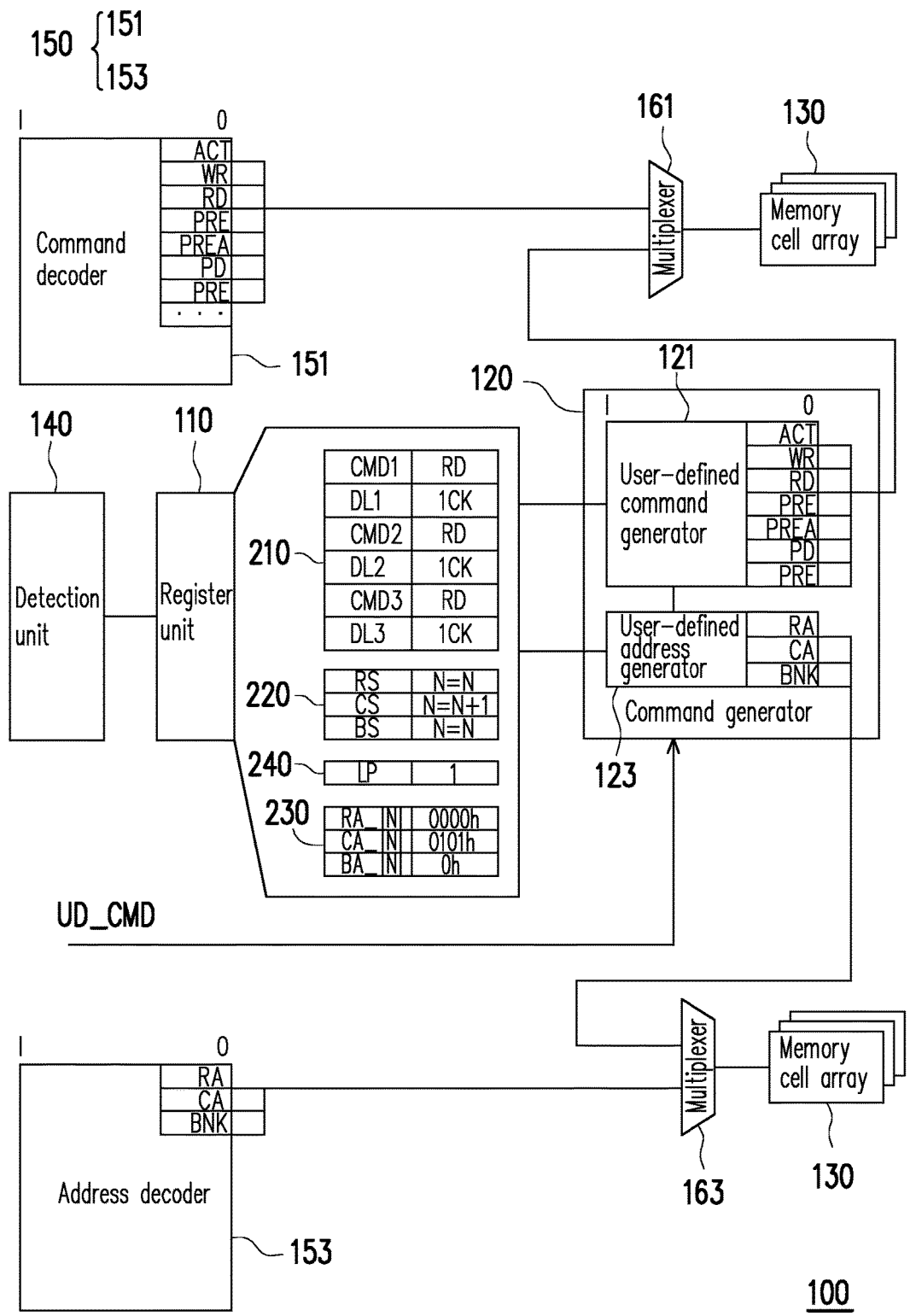
FIG. 5 is a schematic diagram of a structure of a memory apparatus according to an embodiment of the invention.
Figure 6:
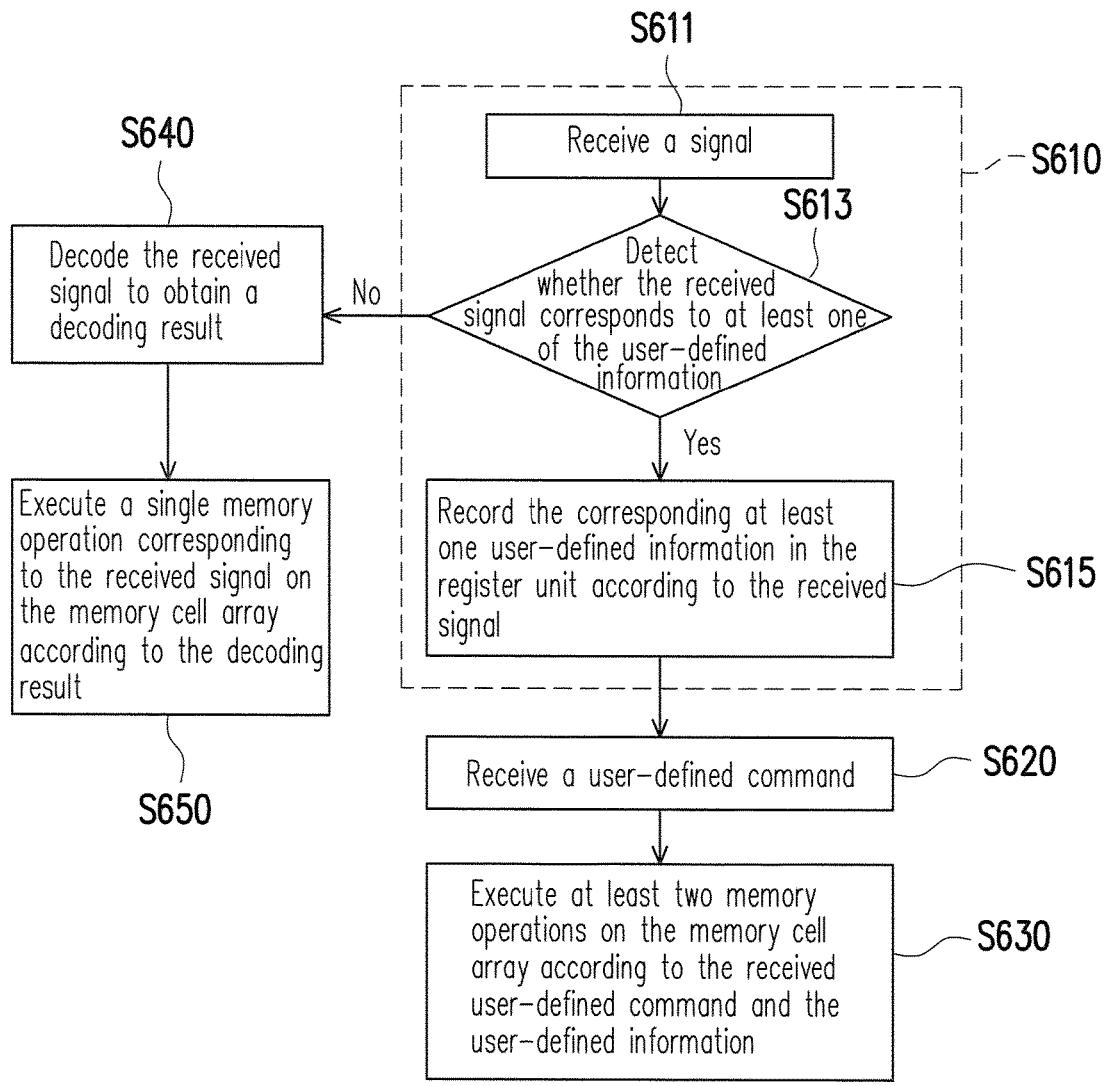
FIG. 6 is a flowchart illustrating an operating method of memory apparatus according to an embodiment of the invention.

FIG. 5 is a schematic diagram of a structure of a memory apparatus according to an embodiment of the invention. FIG. 6 is a flowchart illustrating an operating method of memory apparatus according to an embodiment of the invention. Referring to FIG. 5, besides the register unit 110, the command generator 120 and the memory cell array 130, the memory apparatus 100 of the present embodiment further includes a detection unit 140, a signal decoder 150 and a plurality of multiplexers 161 and 163. It should be noted that the command generator 120 of the present embodiment include a user-defined command generator 121 and a user-defined address generator 123, and the signal decoder 150 includes a command decoder 151 and an address decoder 153.

Referring to FIG. 5 and FIG. 6, in step S610, the memory apparatus 100 writes a plurality of user-defined information UD_INFO in the register unit 110. In the present embodiment, the step of writing the user-defined information UD_INFO in the register unit 110 further includes steps S611-S615. In step S611, the memory apparatus 100, for example, receives a signal from external. In step S613, the detection unit 140 detects whether the received signal is a write signal corresponding to at least one of the user-defined information UD_INFO. If the received signal is the write signal corresponding to at least one of the user-defined information UD_INFO, in step S615, the at least one user-defined information UD_INFO corresponding to the write signal is recorded in the register unit 110 according to the write signal. In the present embodiment, the write signal corresponding to at least one of the user-defined information UD_INFO is, for example, a write signal defined by the user. Therefore, the steps S611-S615 are, for example, repeatedly executed to record the user-defined information UD_INFO required by the user.

For example, the memory apparatus 100, for example, receives the write signal corresponding to the command flow information 210 from external, and the command flow information 210 includes at least two command information and at least one delay information. After the detection unit 140 detects that the received write signal corresponds to the command flow information 210, the command flow information 210 can be written in the register unit 110 according to the write signal. Moreover, the memory apparatus 100 may receive another write signal corresponding to the loop information 240 from external. After the detection unit 140 detects that the received write signal corresponds to the loop information 240, the loop information 240 can be written in the register unit 110 according to the write signal. However, the content of the user-defined information UD_INFO corresponding to the write signal is not limited by the invention. Namely, the write signal of the present embodiment may correspond to one of the command flow information, the initial address information, the address increment information and the loop information or a combination thereof. In other embodiments, those skilled in the art may define the write signal corresponding to different user-defined information according to an actual requirement.

After the user-defined information UD_INFO is recorded in the register unit 110, in step S620, the command generator 120 receives the user-defined command UD_CMD. In the present embodiment, the user-defined command UD_CMD is, for example, generated by the user through at least one hotkey, and is transmitted to the command generator 120 through the memory controller, though the invention is not limited thereto. In other embodiments, the user-defined command UD_CMD can be defined as any other type of trigger signal.

Once the command generator 120 receives the user-defined command UD_CMD, a step S630 is executed, and in the step S630, the command generator 120 executes at least two memory operations on the memory cell array 130 according to the received user-defined command UD_CMD and the user-defined information UD_INFO recorded in the register unit 110. In the present embodiment, the multiplexer 161 is coupled to the user-defined command generator 121 and the command decoder 151, and the multiplexer 163 is coupled to the user-defined address generator 123 and the address decoder 153. When the command generator 120 receives the user-defined command UD_CMD, the multiplexer 161 switches to make the user-defined command generator 121 to send a command to the memory cell array 130 according to the command flow information 210, and the multiplexer 163 switches to make the user-defined address generator 123 to provide address information to the memory cell array 130 according to the address increment information 220, the initial address information 230 and the loop information 240. In the present embodiment, the step that the command generator 120 executes at least two memory operations on the memory cell array 130 according to the received user-defined command UD_CMD and the user-defined information UD_INFO recorded in the register unit 110 has been described in detail in the aforementioned embodiment, so that detail thereof is not repeated.

Referring back to step S613, if the received signal is not the write signal corresponding to at least one of the user-defined information UD_INFO, a step S640 is executed, and in the step S640, the signal decoder 150 decodes the received signal to obtain a decoding result. Then, in step S650, a single memory operation corresponding to the received signal is executed on the memory cell array 130 according to the decoding result. In the present embodiment, the signal decoded by the signal decoder 150 is, for example, an external signal corresponding to the single memory operation, and the decoding result includes a memory command and address information. The command decoder 151 decodes the external signal to obtain the corresponding memory command. The multiplexer 161 switches to make the command decoder 151 to execute the corresponding single memory operation on the memory cell array 130 according to the memory command. On the other hand, the address decoder 153 decodes the external signal to obtain the corresponding address information. The multiplexer 163 switches to make the address decoder 153 to provide the address information of the memory cell array 130, so as to implement the aforementioned single memory operation.

In other words, in the present embodiment, the plurality of user-defined information UD_INFO is recorded in the register unit 110. If the memory apparatus 100 receives the external signal corresponding to the single memory operation, and does not receive the user-defined command UD_CMD serving as the trigger signal, the single memory operation is executed on the memory cell array 130 according to a decoding result of the external signal. Particularly, if the command generator 120 of the memory apparatus 100 receives the user-defined command UD_CMD serving as the trigger signal, the command generator 120 executes the at least two memory operations on the memory cell array 130 according to the user-defined command UD_CMD and the user-defined information UD_INFO recorded in the register unit 110.

It should be noted that regarding a third generation double data rate synchronous dynamic random access memory (DDR3l SDRAM), when an external signal corresponding to a read operation is received from the memory controller, a readable data length is 8 bits, i.e. a burst length (BL) is 8. However, in the present embodiment, the three command information CMD1-CMD3 included in the command flow information 210 all correspond to the read operation RD. Therefore, when the user wants to read data of 24 bits from the memory apparatus 100, the user only requires to transmit one user-defined command UD_CMD to the command generator 120 of the memory apparatus 100, the three read operations are then sequentially executed to read the data of 24 bits. In other words, through the user-defined command UD_CMD of the invention, two or more same memory operations can be sequentially executed to the memory cell array 130.

Moreover, the user-defined command of the invention corresponds to the user-defined information, though the number of the user-defined command is not limited by the invention. In other embodiments, the register unit may also record a plurality sets of user-defined information, where each set of the user-defined information includes command flow information, address increment information, initial address information and loop information, etc., and one set of the user-defined information is selected according to a type of the received user-defined command to serve as a reference to execute at least two memory operations on the memory cell array. For example, the register unit, for example, records first user-defined information and second user-defined information. When the user input a hotkey combination to generate a first user-defined command, and the command generator receives the first user-defined command, the command generator executes at least two memory operations corresponding to the first user-defined information on the memory cell array according to the first user-defined information recorded in the register unit. On the other hand, when the command generator receives a second user-defined command from a host system, the command generator executes at least two memory operations corresponding to the second user-defined information on the memory cell array according to the second user-defined information recorded in the register unit.

In summary, according to the memory apparatus and the operating method of memory apparatus of the embodiments of the invention, the user-defined information is recorded in the register unit of the memory apparatus, and when the user-defined command is received, the memory apparatus is triggered to execute at least two memory operations on the memory cell array of the memory apparatus according to the received user-defined command and the user-defined information recorded in the register unit. In this way, the number of times of command transmission is decreased to decrease system power consumption.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A memory apparatus, comprising:
   a memory cell array, comprising a plurality of memory cells;
   a register unit, configured to record a plurality of pieces of user-defined information, wherein each piece of user-defined information comprises at least two pieces of command information and each piece of command information corresponds to a single memory operation; and
   a command generator, coupled to the register unit and the memory cell array,
   wherein in response to a single user-defined command received by the command generator from a memory controller, the command generator sequentially executes at least two memory operations on the memory cell array according to the at least two pieces of command of one of the pieces of user-defined which is corresponding to the received user-defined command.

2. The memory apparatus as claimed in claim 1, further comprising:
   a detection unit, configured to receive a write signal, and detecting whether the write signal corresponds to at least one of the pieces of user-defined ,
   wherein when the write signal corresponds to at least one of the pieces of user-defined information, the corresponding at least one piece of user-defined is recorded in the register unit according to the write signal.

3. The memory apparatus as claimed in claim 1, further comprising:
   a signal decoder, configured to receive and decode an external signal, wherein a single memory operation corresponding to the external signal is executed on the memory cell array according to a decoding result of the signal decoder.

4. The memory apparatus as claimed in claim 1, wherein the register unit is a mode register, and at least one of the pieces of user-defined information is written into the mode register in a mode register set state of the memory apparatus.

5. The memory apparatus as claimed in claim 1, wherein each piece of user-defined comprises at least one piece of delay information.

6. The memory apparatus as claimed in claim 5, wherein each piece of user-defined further comprises a piece of loop information,
   wherein the command generator repeatedly executes the memory operations on the memory cell array according to the piece of loop information.

7. The memory apparatus as claimed in claim 6, wherein each piece of user-defined further comprises a piece of initial address information and a piece of address increment information,
   wherein the command generator sequentially operates at least one memory cell in the memory cell array according to the piece of initial address information, the piece of address increment and the piece of loop information.

8. The memory apparatus as claimed in claim 1, wherein the at least two memory operations corresponding to the at least two pieces of command information in one piece of user-defined comprise a first memory operation and a second memory operation, and the first memory operation is the same to the second memory operation.

9. The memory apparatus as claimed in claim 1, wherein the memory operation is one of no operation, an activate operation, a read operation, a write operation, a precharge operation and a power down operation.

10. The memory apparatus as claimed in claim 1, wherein the user-defined command is generated through at least one hotkey.

11. An operating method of a memory apparatus, adapted to the memory apparatus comprising a memory cell array and a register unit, the operating method of memory apparatus comprising:
    writing a plurality of pieces of user-defined information into the register unit, wherein each piece of user-defined comprises at least two pieces of command information and each piece of command corresponds to a single memory operation;
    receiving a single user-defined command from a memory controller; and
    in response to the user-defined command received, sequentially executing at least two memory operations on the memory cell array according to the at least two pieces of command information of one of the pieces of user-defined information which is corresponding to the received user-defined command.

12. The operating method of the memory apparatus as claimed in claim 11, wherein the step of writing the pieces of user-defined information into the register unit comprises:
    receiving a write signal;
    detecting whether the write signal corresponds to at least one of the pieces of user-defined information; and
    recording the corresponding piece of at least one user-defined information in the register unit according to the write signal when the write signal corresponds to at least one of the pieces of user-defined information.

13. The operating method of the memory apparatus as claimed in claim 11, further comprising:
    receiving and decoding an external signal to obtain a decoding result; and
    executing a single memory operation corresponding to the external signal on the memory cell array according to the decoding result.

14. The operating method of the memory apparatus as claimed in claim 11, wherein the register unit is a mode register, and at least one of the pieces of user-defined information is written into the mode register in a mode register set state of the memory apparatus.

15. The operating method of the memory apparatus as claimed in claim 11, wherein the step of writing the pieces of user-defined information into the register unit comprises:
    for each piece of user-defined information, writing at least one pieces of delay information into the register unit.

16. The operating method of the memory apparatus as claimed in claim 15, wherein the step of writing the pieces of user-defined information into the register unit comprises:

for each piece of user-defined information, writing a piece of loop information into the register unit, wherein the step of sequentially executing the at least two memory operations on the memory cell array according to the at least two pieces of command information of the one of the pieces of user-defined information which is corresponding to the received user-defined command comprises:

repeatedly executing the at least two memory operations on the memory cell array according to the piece of loop information.

17. The operating method of the memory apparatus as claimed in claim 16, wherein the step of writing the pieces of user-defined information into the register unit comprises:

for each piece of user-defined information, writing a piece of initial address information and a piece of address increment into the register unit, wherein the step of sequentially executing the at least two memory operations on the memory cell array according to the at least two pieces of command of the one of the pieces of user-defined information which is corresponding to the received user-defined command comprises:

sequentially executing the at least two memory operations on at least one memory cell in the memory cell array according to the piece of initial address information, the piece of address increment and the piece of loop information.

18. The operating method of the memory apparatus as claimed in claim 11, wherein the step of sequentially executing the at least two memory operations on the memory cell array according to the at least two pieces of command information of the one of the pieces of user-defined which is corresponding to the received user-defined command comprises:

sequentially executing a first memory operation and a second memory operation on the memory cell array according to the at least two pieces of command information of the one of the pieces of user-defined information, wherein the first memory operation is the same to the second memory operation.

19. The operating method of the memory apparatus as claimed in claim 11, wherein the memory operation is one of no operation, an activate operation, a read operation, a write operation, a precharge operation and a power down operation.

20. The operating method of the memory apparatus as claimed in claim 11, wherein the user-defined command is generated through at least one hotkey.

* * * * *